United States Patent
Du

(10) Patent No.: US 8,942,326 B2
(45) Date of Patent: Jan. 27, 2015

(54) CHANNEL DECODING METHOD AND TAIL BITING CONVOLUTIONAL DECODER

(75) Inventor: Fanping Du, Shenzhen (CN)

(73) Assignee: ZTE Corporation, Shenzhen, Guangdong Province (CN)

( * ) Notice: Subject to any disclaimer, the term of this patent is extended or adjusted under 35 U.S.C. 154(b) by 34 days.

(21) Appl. No.: 13/814,463

(22) PCT Filed: Apr. 25, 2011

(86) PCT No.: PCT/CN2011/073284
§ 371 (c)(1),
(2), (4) Date: Feb. 5, 2013

(87) PCT Pub. No.: WO2012/019465
PCT Pub. Date: Feb. 16, 2012

(65) Prior Publication Data
US 2013/0136215 A1    May 30, 2013

(30) Foreign Application Priority Data
Aug. 11, 2010  (CN) .......................... 2010 1 0251684

(51) Int. Cl.
*H03D 1/00* (2006.01)
*H04L 27/06* (2006.01)
*H04L 1/00* (2006.01)
*H03M 13/41* (2006.01)
*H03M 13/00* (2006.01)

(52) U.S. Cl.
CPC ........... *H04L 1/0036* (2013.01); *H03M 13/413* (2013.01); *H03M 13/6525* (2013.01); *H03M 13/4161* (2013.01)
USPC ............ 375/341; 375/262; 375/265; 375/269

(58) Field of Classification Search
CPC .... H04L 1/0054; H04L 25/065; H04L 1/0045
See application file for complete search history.

(56) References Cited

U.S. PATENT DOCUMENTS

| 8,549,386 | B2 * | 10/2013 | Lu et al. ........................ | 714/786 |
| 2003/0131306 | A1 * | 7/2003 | Ting et al. ..................... | 714/758 |
| 2005/0063495 | A1 * | 3/2005 | Aue ............................... | 375/341 |
| 2011/0280345 | A1 * | 11/2011 | Doan et al. ..................... | 375/341 |

FOREIGN PATENT DOCUMENTS

| CN | 1855732 A | 11/2006 |
| CN | 1992576 A | 7/2007 |

OTHER PUBLICATIONS

International Search Report (Form PCT/ISA/210) for PCT/CN2011/073284, mailed Jul. 21, 2011.

* cited by examiner

*Primary Examiner* — Qutbuddin Ghulamali
(74) *Attorney, Agent, or Firm* — Koppel, Patrick, Heybl & Philpott

(57) ABSTRACT

The disclosure provides a channel decoding method and a tail biting convolutional decoder. The method comprises: the tail biting convolutional decoder performs add-compare-select processing on metric values of $2^N$ states according to input data to be decoded and N zeros input after the data to obtain final cumulative metric values of the $2^N$ states, and stores selection result of add-compare-select processing, wherein N is the constraint length of tail biting convolutional coding; the tail biting convolutional decoder starts to backtrack from one state of the $2^N$ states according to the selection result to obtain intermediate decoding result after the add-compare-select processing is finished; the tail biting convolutional decoder outputs the bits except the last N bits of the intermediate decoding result as decoded result of the data to be decoded. The tail biting convolutional decoder comprises an add-compare-select module, a backtracking module and an outputting module.

10 Claims, 3 Drawing Sheets

CHANNEL DECODING METHOD AND TAIL BITING CONVOLUTIONAL DECODER

FIELD OF THE INVENTION

The disclosure relates to the field of communication, and in particular to a channel decoding method and a tail biting convolutional decoder.

BACKGROUND OF THE INVENTION

In the Long Term Evolution (LTE) system of the third generation radio communication, convolutional coding is widely applied to the channels such as the Broadcast Channel (BCH), the Downlink Control Information (DCI) channel and the Uplink Control Information (UCI) channel. For improving coding rate and performance, the tail biting convolutional coding is adopted to perform channel coding in the LTE system.

The structure of an encoder of the tail biting convolutional coding adopted in the LTE system is shown in FIG. 1. The encoding rate of the tail biting convolutional coding is 1/3. The initial value of state register of the encoder is set as the corresponding value of the last 6 information bits of input data stream, so as to make the initial state of the shift register be the same as the final state of the shift register.

At present, the decoding method of the tail biting convolutional code usually is the Viterbi algorithm, which mainly comprises the following steps.

Step 1: computing the path metric value according to the input data to be decoded, and accumulating the path metric value to the original state metric value to obtain a new state metric value.

Step 2: keeping 64 maximum state metric values through the add-compare-select processing, and saving the selection path, wherein the path relationship diagram of the add-compare-select processing is shown in FIG. 3.

Step 3: because of tail biting, Step 1 and Step 2 can be repeated until the decoding performance meets the requirement, as shown in FIG. 2.

Step 4: backtracking. The state of the tail biting convolution is not returned to zero, so that the backtracking can start either from any state point or from the point of the maximum state metric value.

Because the correctness of data at backtracking point cannot be ensured when backtracking from any state point, a certain backtracking depth is required to ensure that the backtracking path is stabilized to the surviving path (the backtracking depth is usually 5 to 10 times of the constraint length). Thus, for achieving the same performance, backtracking from any state point needs more computing time and more storage resource of path than backtracking from the point of the maximum state metric value.

The advantage of backtracking from the point of the maximum state metric value is that: the maximum state metric conforms to the most fundamental principle of the Viterbi decoding: the maximum likelihood principle. Hence, the point of the maximum state metric value is the starting point of the surviving path. The confidence of the data backtracked from this point is highest, and the data can be directly output as the decoded data without needing to compute the data with large backtracking depth or to save storage resource of this path. The disadvantage of backtracking from the point of the maximum state metric value is that: certain resource is needed to search for the point of the maximum state metric value, and the maximum value is selected from 64 state metric values.

Searching for the maximum value in 64 state metric values is a searching problem. At present, for hardware implementation, there are usually two methods, namely, the serial comparison and the parallel comparison. The serial comparison needs only one comparator, but needs to compare for 64 times in order. The serial comparison needs longer comparison time, and thus wastes time. If the parallel comparison wants to obtain the maximum value by comparing with only one step, it needs 63 comparators, thereby needing more comparison resource.

SUMMARY OF THE INVENTION

The disclosure provides a channel decoding method and a tail biting convolutional decoder, for at least solving the problems that the serial comparison needs longer comparison time and the parallel comparison needs more comparison resource.

In one aspect of the disclosure, a channel decoding method is provided, which comprises the following steps: performing, by a tail biting convolutional decoder, add-compare-select processing on metric values of $2^N$ states according to input data to be decoded and N zeros input after the data to be decoded to obtain final cumulative metric values of the $2^N$ states, and storing, by the tail biting convolutional decoder, a selection result of the add-compare-select processing, wherein N is a constraint length of tail biting convolutional coding; backtracking, by the tail biting convolutional decoder, from one state of the $2^N$ states according to the selection result to obtain an intermediate decoding result, after the add-compare-select processing is finished; and outputting, by the tail biting convolutional decoder, bits except last N bits of the intermediate decoding result as decoded result of the data to be decoded.

The tail biting convolutional decoder obtaining the final cumulative metric values of the $2^N$ states comprises the following steps: performing, by the tail biting convolutional decoder, the add-compare-select processing on the metric values of the $2^N$ states according to the input data to be decoded to obtain intermediate cumulative metric values of the $2^N$ states; and by taking the intermediate cumulative metric values of the $2^N$ states as initial values, continuing to perform N times of the add-compare-select processing to the metric values of the $2^N$ states according to the N zeros input after the data to be decoded to obtain the final cumulative metric values of the $2^N$ states.

A way of performing the add-compare-select processing comprises: in the process that the $2^N$ states transit from a previous moment to a current moment, respectively accumulating a newly added metric value of this transition to two optional states corresponding to each state before this transition, wherein the newly added metric value is an Euclidean distance calculated by using input data; and selecting a larger value of accumulating as a new cumulative metric value of a corresponding state after this transition.

The tail biting convolutional decoder starting to backtrack from one state of the $2^N$ states according to the selection result to obtain the intermediate decoding result comprises the following steps: by taking one state of the $2^N$ states as the starting point of backtracking, searching, by the tail biting convolutional decoder, for a parent state according to the selection result until all history states are found; and composing, by the tail biting convolutional decoder, lowest bits output by all the history states into the intermediate decoding result, according to a negative direction of backtracking.

One state of the $2^N$ states is zero state.

In another aspect of the disclosure, a tail biting convolutional decoder is provided, which comprises an add-compare-select module, configured to perform add-compare-select processing on metric values of $2^N$ states according to data to be decoded which is input to the tail biting convolutional decoder and N zeros input after the data to be decoded to obtain final cumulative metric values of the $2^N$ states, and store a selection result of the add-compare-select processing, wherein N is a constraint length of tail biting convolutional coding; a backtracking module, configured to backtrack from one state of the $2^N$ states according to the selection result to obtain an intermediate decoding result after the add-compare-select module finishes the add-compare-select processing; and an outputting module, configured to output bits except last N bits of the intermediate decoding result as decoded result of the data to be decoded.

The add-compare-select module comprises: a first processing module, configured to perform the add-compare-select processing on the metric values of the $2^N$ states according to the data to be decoded which is input to the tail biting convolutional decoder to obtain intermediate cumulative metric values of the $2^N$ states; and a second processing module, configured to, by taking the intermediate cumulative metric values of the $2^N$ states as initial values, continue to perform N times of the add-compare-select processing to the metric values of the $2^N$ states according to the N zeros input after the data to be decoded to obtain the final cumulative metric values of the $2^N$ states.

A way of performing the add-compare-select processing by the add-compare-select module comprises: in the process that the $2^N$ states transit from a previous moment to a current moment, respectively accumulating a newly added metric value of this transition to two optional states corresponding to each state before this transition, wherein the newly added metric value is an Euclidean distance calculated by using the input data; and selecting a larger value of accumulating as a new cumulative metric value of a corresponding state after this transition.

The backtracking module comprises: a searching module, configured to, by taking one state of the $2^N$ states as the starting point of backtracking, search for a parent state according to the selection result until all history states are found; and a composing module, configured to compose lowest bits output by all the history states into the intermediate decoding result, according to a negative direction of backtracking.

One state of the $2^N$ states is zero state.

Through the disclosure, when the traditional decoding process is completed, additionally N zeros are input, that is, it is needed to perform additional N steps of calculation the input data of which is 0. Finally, all the cumulative metric values of the $2^N$ states are equal to the maximum values of the cumulative metric values of the $2^N$ states when the traditional decoding process is completed. Thus, there is no need to specially search for the maximum state metric value. During backtracking, the point of the maximum state metric value can be backtracked from any state by only N steps. Then the output decoded data can be obtained by normally backtracked from the point of the maximum state metric value. Thereby, this solution saves the resource of searching for the maximum state metric value, that is, saves the comparison time and the comparison resource.

BRIEF DESCRIPTION OF THE DRAWINGS

The drawings described herein are used for providing a deeper understanding of the disclosure, and constitute a part of the application. The schematic embodiments of the disclosure and the description thereof are used for illustrating the disclosure and are not intended to form improper limit to the disclosure. In the drawings.

DETAILED DESCRIPTION OF THE EMBODIMENTS

The disclosure is described hereinafter in detail with reference to the drawings and embodiments. It should be noted that the embodiments and features in the embodiments in the application can be combined with each other if not conflicting.

Figure 4:
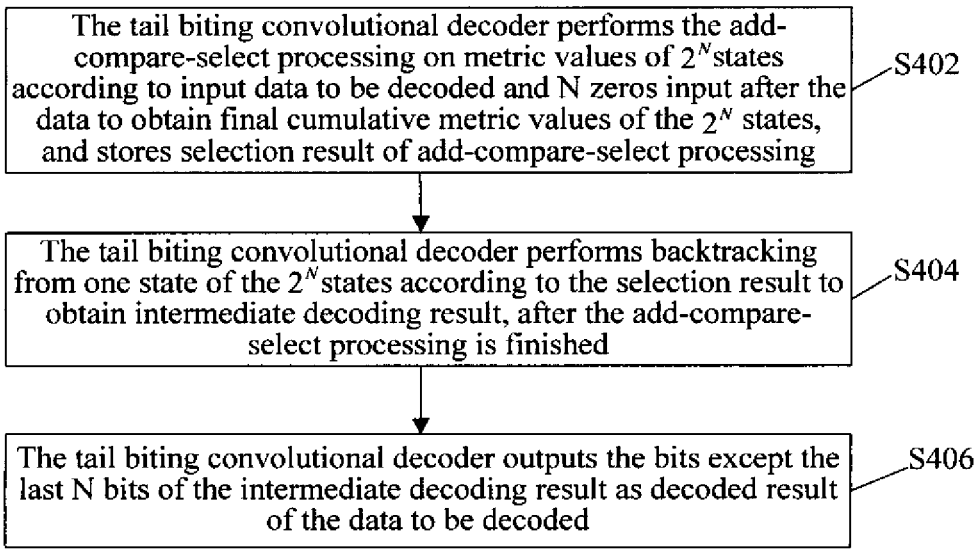
FIG. 4 shows a diagram of a channel decoding method according to an embodiment of the disclosure.

FIG. 4 shows a diagram of a channel decoding method according to an embodiment of the disclosure. The channel decoding method comprises the following steps.

Step S402: the tail biting convolutional decoder performs the add-compare-select processing on the metric values of the $2^N$ states according to the input data to be decoded and N zeros input after the data to obtain the final cumulative metric values of the $2^N$ states, and stores the selection result of add-compare-select processing, wherein N is the constraint length of tail biting convolutional coding.

Step S404: the tail biting convolutional decoder performs backtracking from one state of the $2^N$ states according to the selection result to obtain the intermediate decoding result after the add-compare-select processing is finished.

Step S406: the tail biting convolutional decoder outputs the bits except the last N bits of the intermediate decoding result as the decoded result of the data to be decoded.

On the basis of fully understanding the backtracking essence of the Viterbi decoding method, the embodiment adopts the idea of returning to zero. Through the embodiment, when the traditional decoding process is completed, additionally N zeros are input, that is, it is needed to perform additional N steps of calculation the input data of which is 0. Finally, all the cumulative metric values of the $2^N$ states (namely, the above-mentioned final cumulative metric values) are equal to the maximum values of the cumulative metric values of the $2^N$ states (namely, the maximum state metric value) when the traditional decoding process is completed. Thus, there is no need to specially search for the maximum state metric value. During backtracking, the point of the maximum state metric value can be backtracked from any state by only N steps. Then the output decoded data can be obtained by normally backtracked from the point of the maximum state metric value. Thereby, this embodiment saves the resource of searching for the maximum state metric value, that is, saves the comparison time and the comparison resource.

Because the above method additionally inputs N zeros to force the state of the tail biting convolutional decoder to return to zero, the method can also be called a method of forced return-to-zero.

Obviously, in above method, additional M (M is more than or equal to N) zeros can be input after the data to be decoded. Then, all the final cumulative metric values of the $2^N$ states can also be equal to the maximum value of the cumulative metric values of the $2^N$ states when the traditional decoding process is completed. After subsequent backtracking, in Step S406, the bits except the last M bits of the obtained intermediate decoding result are output as the decoded result of the data to be decoded. But preferably, it should be that N zeros are input.

Preferably, Step S402 comprises that: the tail biting convolutional decoder performs the add-compare-select processing on the metric values of the $2^N$ states according to the input data to be decoded to obtain the intermediate cumulative metric values of the $2^N$ states; and by taking the intermediate cumulative metric values of the $2^N$ states as initial values, the tail biting convolutional decoder continues to perform N times of add-compare-select processing to the metric values of the $2^N$ states according to the N zeros input after the data to be decoded to obtain the final cumulative metric values of the $2^N$ states.

Specifically, the principle of the above method is that: the add-compare-select processing of Viterbi decoding is actually a natural comparator. By inputting the data zeros (namely, the path metric value is 0), it actually completes the comparison of the metric values of the $2^N$ states without changing the state metric value itself. Thus, by computing the input data zeros for N steps (namely, performing N times of add-compare-select processing), it actually completes the process of selecting the maximum value from the metric values of the $2^N$ states. This process can be backtracked because it is same as the normal process of inputting non-zero data. By storing the surviving path (namely, the selection result of the add-compare-select processing), it actually stores the path of searching for the maximum value, so that the point of the maximum state metric value can be backtracked by only N steps through a normal backtracking process.

In fact, the add-compare-select processing always keeps the larger values. Thus, all the final cumulative metric values of the $2^N$ states are updated to the maximum state metric value through the additional N steps of calculation of the input data zeros. Hence, backtracking from any state point, it can return to the point of the maximum state metric value by N steps. Thus, it is only needed to additionally input N zeros, instead of the process of comparing and searching to obtain the maximum value. This solution saves the comparison time and the comparison resource.

Figure 1:
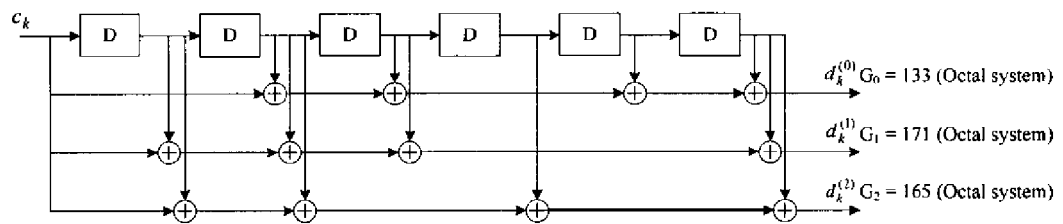
FIG. 1 shows a structure diagram of a tail biting convolutional encoder according to related technologies.
Figure 2:
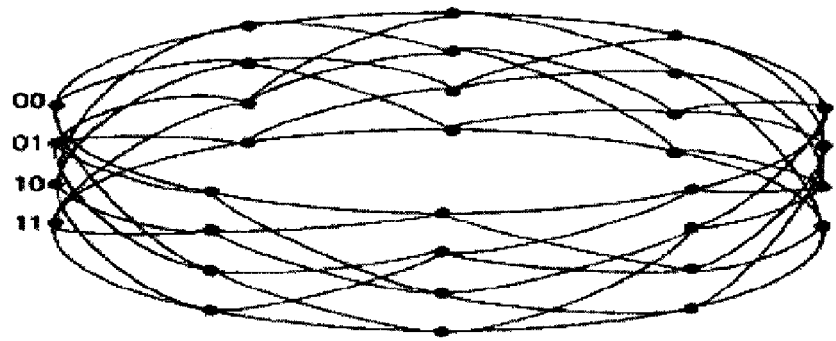
FIG. 2 shows a trellis diagram of the tail biting convolutional coding according to related technologies.
Figure 3:
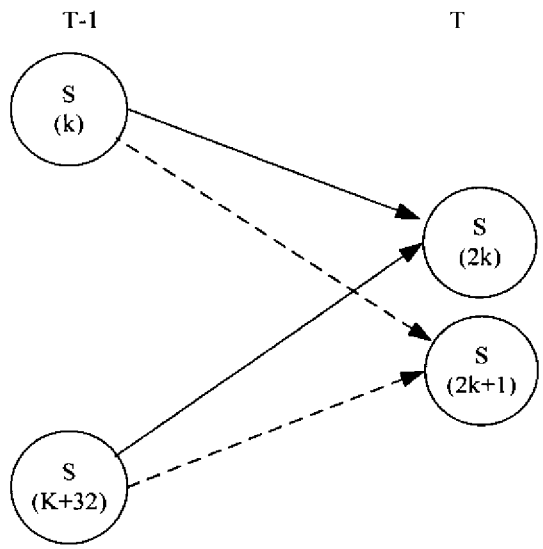
FIG. 3 shows a path relationship diagram of add-compare-select processing according to related technologies.

In the above, the way of performing the add-compare-select processing comprises: as shown in FIG. 3, in the process that the $2^N$ states transit from the previous moment to the current moment, respectively accumulating the newly added metric value of this transition to two optional states corresponding to each state before this transition, wherein the newly added metric value (also called the path metric value) is the Euclidean distance which is calculated by using the input data; and selecting the larger value of accumulating as the new cumulative metric values of a corresponding state after this transition.

The metric value of the (2k)th state of the current moment T is obtained by performing the add-compare-select processing to the metric value of the kth state and the metric value of the (K+32)th state of the previous moment T−1 (the added value is the path metric value). Similarly, the metric value of the (2k+1)th state of the current moment T is obtained by performing the add-compare-select processing to the metric value of the kth state and the metric value of the (K+32)th state. Thus, when the input data is 0, namely the path metric value is 0, the larger one from the metric values of the two optional states is selected as the metric value of the current moment T.

In the LTE system, the length of the encoding register set is 6. That is, the constraint length N is equal to 6. It is only needed to additionally input 6 zeros and additionally calculate 6 steps (i.e., additionally performing 6 times of add-compare-select processing).

Preferably, Step S404 comprises that: by taking any one of the $2^N$ states as the starting point of backtracking, the tail biting convolutional decoder searches for the parent state according to the selection result until all the history states are found; and the tail biting convolutional decoder composes the lowest bits output by all the history states into the intermediate decoding result, according to the negative direction of the backtracking.

The preferred embodiment provides a specific implementation of backtracking by the tail biting convolutional decoder. All the final cumulative metric values of the states can be made to be equal to the maximum value by additionally inputting N zeros and additionally performing N times of add-compare-select processing in Step S402. Thus during backtracking, backtracking from any state can return to the point of the maximum state metric value. That is, backtracking from any state is equal to backtracking from the maximum state metric value.

The only difference between the needed additional N steps of calculation and backtracking process in the preferred embodiment and the traditional decoding process is that the input data is set to 0. Thus, this process is easy to realize and very efficient.

Preferably, any one of the $2^N$ states can be the zero state. That is to say, backtracking from the zero state can be selected in the backtracking of Step S404, which is more convenient for hardware implementation. And, it is obvious for those skilled in the art that backtracking can also start from the last state.

Essentially, the above channel decoding method according to an embodiment of the disclosure still is a method of backtracking from the point of the maximum state metric value. Its advantage is that no time and resource exclusive for searching for the maximum state metric value are needed, and it is easy to realize and very efficient.

In actual implementation, the channel decoding method (specifically, the Viterbi decoding method for tail biting convolutional coding) according to a preferred embodiment of the disclosure is described in detail by taking the channel decoding of the LTE system for example. Here, N is equal to 6. The method comprises the following steps:

Step 1: performing the add-compare-select processing and storing the path according to the normal decoding process until the normal decoding is finished;

Step 2: setting the input data to 0 (additionally inputting 6 zeros), and continuing to perform the add-compare-select processing and store the path;

Step 3: repeating Step 2 for N times; and

Step 4: backtracking from the zero state, discarding the N bits of data which is obtained from the earliest backtracking, and outputting the remaining bits of data as the decoded result of the data to be decoded.

Figure 5:
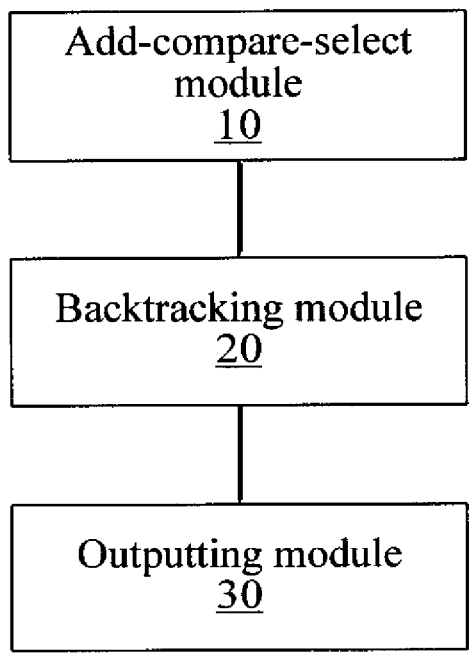
FIG. 5 shows a structure diagram of a tail biting convolutional decoder according to an embodiment of the disclosure.

FIG. 5 shows a structure diagram of a tail biting convolutional decoder according to an embodiment of the disclosure. The tail biting convolutional decoder comprises: the add-compare-select module 10, configured to perform the add-compare-select processing on the metric values of the $2^N$ states according to the data to be decoded, which is input to the tail biting convolutional decoder, and N zeros input after the data to obtain the final cumulative metric values of the $2^N$ states, and store the selection result of add-compare-select processing, wherein N is the constraint length of tail biting convolutional coding; the backtracking module 20, configured to backtrack from any one of the $2^N$ states according to the stored selection result to obtain the intermediate decoding result, after the add-compare-select module 10 finishes the add-compare-select processing; and the outputting module 30, configured to output the bits except the last N bits of the intermediate decoding result as the decoded result of the data to be decoded.

Figure 6:
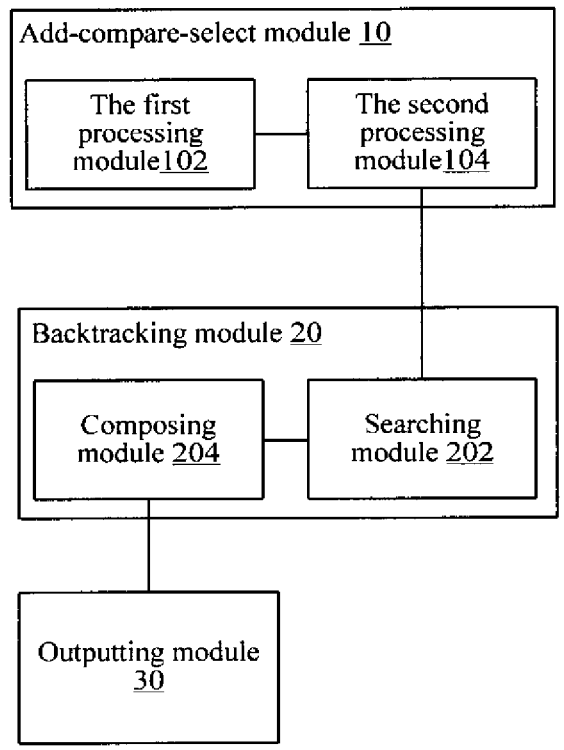
FIG. 6 shows a structure diagram of a tail biting convolutional decoder according to a preferred embodiment of the disclosure.

Preferably, as shown in FIG. 6, the add-compare-select module 10 comprises: the first processing module 102, configured to perform the add-compare-select processing to the metric values of the $2^N$ states according to the data to be decoded, which is input to the tail biting convolutional decoder, to obtain the intermediate cumulative metric values of the $2^N$ states; and the second processing module 104, configured to, by taking the intermediate cumulative metric values of the $2^N$ states as initial values, continue to perform N times of the add-compare-select processing to the metric values of the $2^N$ states according to the N zeros input after the data to be decoded to obtain the final cumulative metric values of the $2^N$ states.

Preferably, the way of performing the add-compare-select processing by the add-compare-select module 10 comprises: in the process that the $2^N$ states transit from the previous moment to the current moment, respectively accumulating the newly added metric value of this transition to two optional states corresponding to each state before this transition, wherein the newly added metric value is the Euclidean distance which is calculated by using the input data; and selecting the larger value of accumulating as the new cumulative metric values of a corresponding state after this transition.

Preferably, the backtracking module 20 comprises: the searching module 202, configured to, by taking any one of the $2^N$ states as the starting point of backtracking, search for the parent state according to the selection result until all the history states are found; and the composing module 204, configured to compose the lowest bits output by all the history states into the intermediate decoding result, according to the negative direction of the backtracking.

Preferably, any one of the $2^N$ states can be zero state. That is to say, during backtracking, the backtracking module 20 can select to backtrack from the zero state. This solution is more convenient for hardware implementation.

It can be seen from above description that the disclosure achieves the following technical effects. The method of forced return-to-zero is adopted to backtrack in the Viterbi decoding process of the tail biting convolutional coding. Thus, the performance of backtracking from the point of the maximum state metric value can be achieved by only additionally calculating the input data zeros for constraint length steps and additionally storing the backtracking path for constraint length steps according to the normal decoding way. And, the time and resource for searching for the maximum state metric value is not needed any more.

Obviously, those skilled in the art should appreciate that above-mentioned modules and steps of the disclosure can be realized by a general-purpose computing device. They can be centralized in a single computing device or distributed on a network composed of multiple computing devices. Optionally, they can be realized by program code which is capable of being executed by the computing device. Therefore, they can be stored in a storage device to be executed by the computing device. In addition, under some conditions, the presented or described steps can be executed in an order different from that described here. Or, they are made into integrated circuit modules, respectively; or multiple modules and steps of them are made into a single integrated circuit module to realize. In this way, the disclosure is not limited to any particular combination of hardware and software.

The above is only the preferred embodiments of the disclosure and is not intended to limit the disclosure. For those skilled in the art, the disclosure may have various modifications and changes. Any modifications, equivalent replacements, improvements and the like within the principle of the disclosure shall fall within the scope of protection of the disclosure.

What is claimed is:

1. A channel decoding method, comprising:

decoding, by a tail biting convolutional decoder, input data to be decoded;

after the decoding of the input data to be decoded is completed, continuing to perform additional M steps of add-compare-select processing by using 0 as a path metric value on metric values of $2^N$ states to obtain final cumulative metric values of the $2^N$ states by the tail biting convolutional decoder, wherein M is more than or equal to N, and N is a constraint length of tail biting convolutional coding;

backtracking, by the tail biting convolutional decoder, from any one state of the $2^N$ states to obtain an intermediate decoding result, after the add-compare-select processing is finished; and outputting, by the tail biting convolutional decoder, bits except last M bits of the intermediate decoding result as decoded result of the data to be decoded.

2. The method according to claim 1, wherein obtaining, by the tail biting convolutional decoder, the final cumulative metric values of the $2^N$ states comprises:

performing, by the tail biting convolutional decoder, the add-compare-select processing on the metric values of the $2^N$ states according to the input data to be decoded to obtain intermediate cumulative metric values of the $2^N$ states; and by taking the intermediate cumulative metric values of the $2^N$ states as initial values, continuing to perform additional M steps of add-compare-select processing by using 0 as the path metric value on the metric values of the $2^N$ states to obtain the final cumulative metric values of the $2^N$ states.

3. The method according to claim 2, wherein performing the add-compare-select processing comprises:

in the process that the $2^N$ states transit from a previous moment to a current moment, for each state, respectively accumulating a path metric value to state metric values of two optional states corresponding to the state before the transition, wherein the path metric value is an Euclidean distance calculated by using input data; and selecting a larger value of accumulating as a new cumulative metric value of a corresponding state after the transition.

4. The method according to claim 1, wherein performing the add-compare-select processing comprises:
in the process that the $2^N$ states transit from a previous moment to a current moment, for each state, respectively accumulating a path metric value to state metric values of two optional states corresponding to the state before the transition, wherein the path metric value is an Euclidean distance calculated by using input data; and
selecting a larger value of accumulating as a new cumulative metric value of a corresponding state after the transition.

5. The method according to claim 1, wherein backtracking, by the tail biting convolutional decoder, from one state of the $2^N$ states according to the selection result to obtain the intermediate decoding result comprises:
by taking one state of the $2^N$ states as the starting point of backtracking, searching, by the tail biting convolutional decoder, for a parent state according to the selection result until all history states are found; and
composing, by the tail biting convolutional decoder, lowest bits output by all the history states into the intermediate decoding result, according to a negative direction of backtracking.

6. A tail biting convolutional decoder, comprising:
an add-compare-select module, configured to decode input data to be decoded; and after the decoding of the input data to be decoded is completed, continue to perform additional M steps of add-compare-select processing by using 0 as a path metric value on metric values of $2^N$ states to obtain final cumulative metric values of the $2^N$ states, wherein M is more than or equal to N, and N is a constraint length of tail biting convolutional coding;
a backtracking module, configured to backtrack from any one state of the $2^N$ states to obtain an intermediate decoding result after the add-compare-select module finishes the add-compare-select processing; and
an outputting module, configured to output bits except last M bits of the intermediate decoding result as decoded result of the data to be decoded.

7. The tail biting convolutional decoder according to claim 6, wherein the add-compare-select module comprises:
a first processing module, configured to perform the add-compare-select processing to the metric values of the $2^N$ states according to the data to be decoded which is input to the tail biting convolutional decoder to obtain intermediate cumulative metric values of the $2^N$ states; and
a second processing module, configured to, by taking the intermediate cumulative metric values of the $2^N$ states as initial values, continue to perform additional M steps of add-compare-select processing by using 0 as the path metric value on the metric values of the $2^N$ states to obtain the final cumulative metric values of the $2^N$ states.

8. The tail biting convolutional decoder according to claim 7, wherein performing the add-compare-select processing by the add-compare-select module comprises:
in the process that the $2^N$ states transit from a previous moment to a current moment, for each state, respectively accumulating a path metric value to state metric values of two optional states corresponding to the state before the transition, wherein the path metric value is an Euclidean distance calculated by using the input data; and
selecting a larger value of accumulating as a new cumulative metric value of a corresponding state after the transition.

9. The tail biting convolutional decoder according to claim 6, wherein performing the add-compare-select processing by the add-compare-select module comprises:
in the process that the $2^N$ states transit from a previous moment to a current moment, for each state, respectively accumulating a path metric value to state metric values of two optional states corresponding to the state before the transition, wherein the path metric value is an Euclidean distance calculated by using the input data; and
selecting a larger value of accumulating as a new cumulative metric value of a corresponding state after the transition.

10. The tail biting convolutional decoder according to claim 6, wherein the backtracking module comprises:
a searching module, configured to, by taking one state of the $2^N$ states as the starting point of backtracking, search for a parent state according to the selection result until all history states are found; and
a composing module, configured to compose lowest bits output by all the history states into the intermediate decoding result, according to a negative direction of backtracking.

* * * * *